US008667379B2

(12) United States Patent
Haustein et al.

(10) Patent No.: US 8,667,379 B2
(45) Date of Patent: Mar. 4, 2014

(54) APPARATUS AND METHOD TO GENERATE, STORE, AND READ, A PLURALITY OF ERROR CORRECTION CODED DATA SETS

(75) Inventors: Nils Haustein, Soergenloch (DE); Craig Anthony Klein, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 1518 days.

(21) Appl. No.: 11/643,533

(22) Filed: Dec. 20, 2006

(65) Prior Publication Data

US 2008/0155383 A1     Jun. 26, 2008

(51) Int. Cl.
*H03M 13/03*     (2006.01)

(52) U.S. Cl.
USPC .......................................... 714/786; 714/774

(58) Field of Classification Search
USPC .................................................. 714/786, 774
See application file for complete search history.

(56) References Cited

U.S. PATENT DOCUMENTS

| | | | | |
|---|---|---|---|---|
| 5,315,602 | A * | 5/1994 | Noya et al. ..................... | 714/766 |
| 5,537,567 | A * | 7/1996 | Galbraith et al. .............. | 711/114 |
| 5,841,378 | A * | 11/1998 | Klayman et al. ................ | 341/61 |
| 5,958,067 | A * | 9/1999 | Kaneda et al. .................. | 714/6 |
| 6,247,157 | B1 * | 6/2001 | Edirisooriya ................. | 714/767 |
| 6,516,443 | B1 | 2/2003 | Zook | |
| 6,601,217 | B1 * | 7/2003 | Smith .......................... | 714/822 |
| 6,606,683 | B2 * | 8/2003 | Mori ............................. | 711/114 |
| 6,631,488 | B1 * | 10/2003 | Stambaugh et al. .......... | 714/746 |
| 6,704,838 | B2 | 3/2004 | Anderson | |
| 6,868,521 | B2 * | 3/2005 | Cohen .......................... | 714/795 |
| 6,996,097 | B1 * | 2/2006 | Chou et al. .................... | 370/389 |
| 7,054,377 | B1 * | 5/2006 | Betts ............................. | 375/265 |
| 7,194,048 | B2 * | 3/2007 | Betts ............................. | 375/341 |
| 7,401,253 | B2 | 7/2008 | Winarski et al. | |
| 7,765,184 | B2 * | 7/2010 | Makela ......................... | 707/603 |

(Continued)

FOREIGN PATENT DOCUMENTS

| | | |
|---|---|---|
| JP | 05290525 | 11/1993 |
| JP | 07141232 | 6/1995 |

(Continued)

OTHER PUBLICATIONS

Jeon et al., "Soft Decision Decoding for Holographic Memories with Intrapage Intensity Variations", Japanese Journal of Applied Physics, Japan, vol. 40, No. 3B, p. 1741-1746, Mar. 2001.

*Primary Examiner* — M. Mujtaba K Chaudry
(74) *Attorney, Agent, or Firm* — Dale F. Regelman; Quarles & Brady LLP

(57) ABSTRACT

An apparatus and method are disclosed to receive information and to generate, store, and read, a plurality of error correction coded data sets using that information. Applicants' storage controller receives information and generates (N) sets of error correction coded data, wherein (N) is greater than or equal to 2. The method writes, for each value of (i), the (i)th set of error correction coded data to the (i)th data storage medium, wherein (i) is greater than or equal to 1 and less than or equal to (N). If Applicants' storage controller receives a request to read the information, then Applicants' method reads each of the (N) error correction coded data sets, generates the information using the (N) error correction coded data sets, and returns the information to the requestor.

17 Claims, 18 Drawing Sheets

(56) References Cited

U.S. PATENT DOCUMENTS

| | | | |
|---|---|---|---|
| 2002/0007476 A1* | 1/2002 | Kishino | 714/763 |
| 2004/0161048 A1* | 8/2004 | Zaleski et al. | 375/265 |
| 2005/0050384 A1* | 3/2005 | Horn | 714/6 |
| 2005/0154841 A1 | 7/2005 | Sastri et al. | |
| 2005/0271167 A1* | 12/2005 | Betts | 375/341 |
| 2007/0033609 A1* | 2/2007 | Dei | 725/25 |
| 2007/0067290 A1* | 3/2007 | Makela | 707/6 |
| 2007/0266296 A1* | 11/2007 | Conley | 714/763 |

FOREIGN PATENT DOCUMENTS

| | | |
|---|---|---|
| JP | 10107866 | 4/1998 |
| JP | 11311938 | 11/1999 |
| JP | 2004-102823 | 4/2004 |
| JP | 2006260008 | 9/2006 |
| JP | 2006318467 | 11/2006 |

* cited by examiner

| INITIAL STATE 201 | DESTINATION STATE 202 | ORIGINAL BIT U(J) 203 | ERROR CORRECTION ENCODED DATA BITS L(0,J), L(1,J), L(2,J) AND L(3,J) 204 |
|---|---|---|---|
| $S_0$ | $S_0$ | 0 | 0000 |
| $S_0$ | $S_1$ | 1 | 1111 |
| $S_1$ | $S_2$ | 0 | 0111 |
| $S_1$ | $S_3$ | 1 | 1000 |
| $S_2$ | $S_4$ | 0 | 1001 |
| $S_2$ | $S_5$ | 1 | 0110 |
| $S_3$ | $S_6$ | 0 | 1110 |
| $S_3$ | $S_7$ | 1 | 0001 |
| $S_4$ | $S_0$ | 0 | 1111 |
| $S_4$ | $S_1$ | 1 | 0000 |
| $S_5$ | $S_2$ | 0 | 1000 |
| $S_5$ | $S_3$ | 1 | 0111 |
| $S_6$ | $S_4$ | 0 | 0110 |
| $S_6$ | $S_5$ | 1 | 1001 |
| $S_7$ | $S_6$ | 0 | 0001 |
| $S_7$ | $S_7$ | 1 | 1110 |

| DATA STORAGE MEDIA | ERROR CORRECTION ENCODED DATA BIT |
|---|---|
| 160 | L(0,J) 440 |
| 170 | L(1,J) 450 |
| 180 | L(2,J) 460 |
| 190 | L(3,J) 470 |

| INITIAL STATE | DESTINATION STATE | ORIGINAL DATA U | ENCODED DATA ARRAY M0,M1,M2,M3 |
|---|---|---|---|
| $S_0$ | $S_1$ | 1 | 1111 |
| $S_1$ | $S_3$ | 1 | 1000 |
| $S_3$ | $S_7$ | 1 | 0001 |
| $S_7$ | $S_7$ | 1 | 1110 |
| $S_7$ | $S_6$ | 0 | 0001 |
| $S_6$ | $S_4$ | 0 | 0110 |
| $S_4$ | $S_0$ | 0 | 1111 |

| ORIGINAL DATA U  701 | BRANCH  702 | READ ENCODED DATA M0,M1,M2,M3  703 | CORRECT PATH  704 | REJECTED PATH  705 | RECOVERED DATA ARRAY M0,M1,M2,M3  706 | DECODED DATA U  707 |
|---|---|---|---|---|---|---|
| 1 | I=0 | 1xy1 | $S_0 \rightarrow S_1$ | $S_0 \rightarrow S_0$ | 1111 | 1 |
| 1 | I=1 | 1xy0 | $S_1 \rightarrow S_3$ | $S_1 \rightarrow S_2$ | 1000 | 1 |
| 1 | I=2 | 0xy1 | $S_3 \rightarrow S_7$ | $S_3 \rightarrow S_6$ | 0001 | 1 |

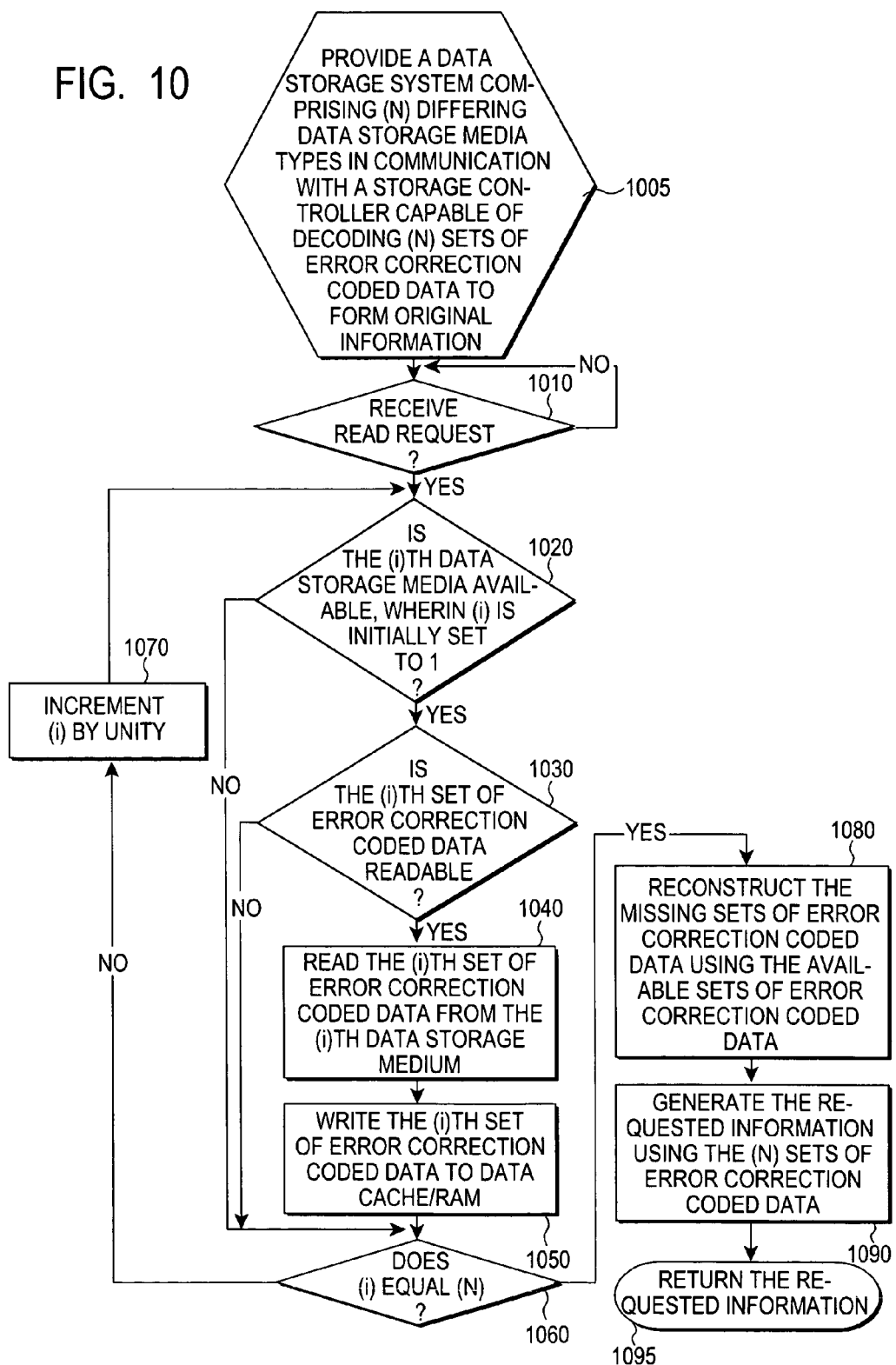

FIG. 13
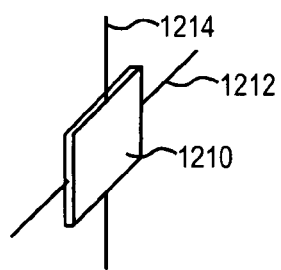
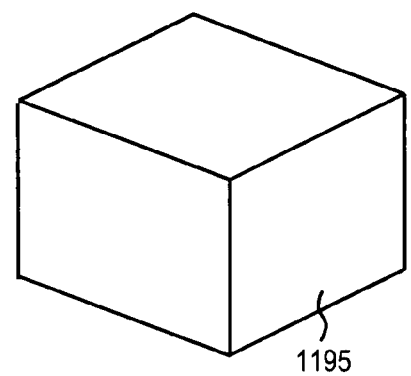
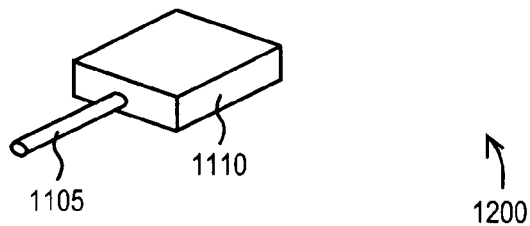

APPARATUS AND METHOD TO GENERATE, STORE, AND READ, A PLURALITY OF ERROR CORRECTION CODED DATA SETS

FIELD OF THE INVENTION

This invention relates to apparatus and method to receive information and to generate, store, and read, a plurality of error correction coded data sets derived from that information.

BACKGROUND OF THE INVENTION

Traditionally a system for information storage comprises a storage controller and an archiving storage. The storage controller receives information from one or more client systems and stores the information in the archiving storage.

SUMMARY OF THE INVENTION

What is needed is an apparatus and method to protect archived information by generating a plurality of error correction coded data sets, and storing that plurality of error correction coded data sets in multiple data storage media. Applicants' apparatus and method utilize convolution encoding to generate multiple redundant error correction coded data sets from the original data. That plurality of error correction coded data sets is then stored on different storage devices and/or media. In the event one or more storage devices and/or data storage media fail and one or more error correction coded data sets become unavailable, those missing data sets can be recreated from the available data sets.

Applicants' invention comprises an apparatus and method to receive information and to generate, store, and read, a plurality of error correction coded data sets derived from that information. Applicants' method supplies a storage controller in communication with (N) different data storage media, wherein, for each value of (i) the (i)th data storage medium comprises a different data storage medium type than the remaining (N−1) data storage media wherein (N) is greater than or equal to 2, and wherein (i) is greater than or equal to 1 and less than or equal to (N).

Applicants' storage controller receives information and generates (N) sets of error correction coded data derived from that information. The method then selects, for each value of (i), the (i)th data storage medium, and writes, for each value of (i), the (i)th set of error correction coded data to the (i)th data storage medium.

Subsequently, Applicant' storage controller receives from a requester a request to read the information. In certain embodiments, Applicant' apparatus and method read each of the (N) error correction coded data sets, generate the information using the (N) error correction coded data sets, and return the information to the requester.

BRIEF DESCRIPTION OF THE DRAWINGS

The invention will be better understood from a reading of the following detailed description taken in conjunction with the drawings in which like reference designators are used to designate like elements, and in which:

FIG. 2 is a table reciting the 8 states used in one embodiment of Applicant' convolution encoding algorithm, wherein each of the 8 original bits called "information" comprises one of two values;

FIG. 4B is a table showing reciting data storage media to which four error correction coded bits generated by the encoder circuit of FIG. 4A are encoded;

FIG. 6 is a table showing an example of the generation of four error correction coded data bits for each bit of original data;

FIG. 7 is a table illustrating one embodiment of Applicant' method to reconstruct missing error correction coded data bits using the available error correction coded data bits;

FIG. 10 is a flow chart summarizing the steps of Applicant' method to read a plurality of error correction coded data sets, and optionally to reconstruct unavailable error correction coded data bits using the available error correction coded data bits;

FIG. 13 is a perspective view of a second embodiment of the apparatus of FIGS. 12A and 12B;

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
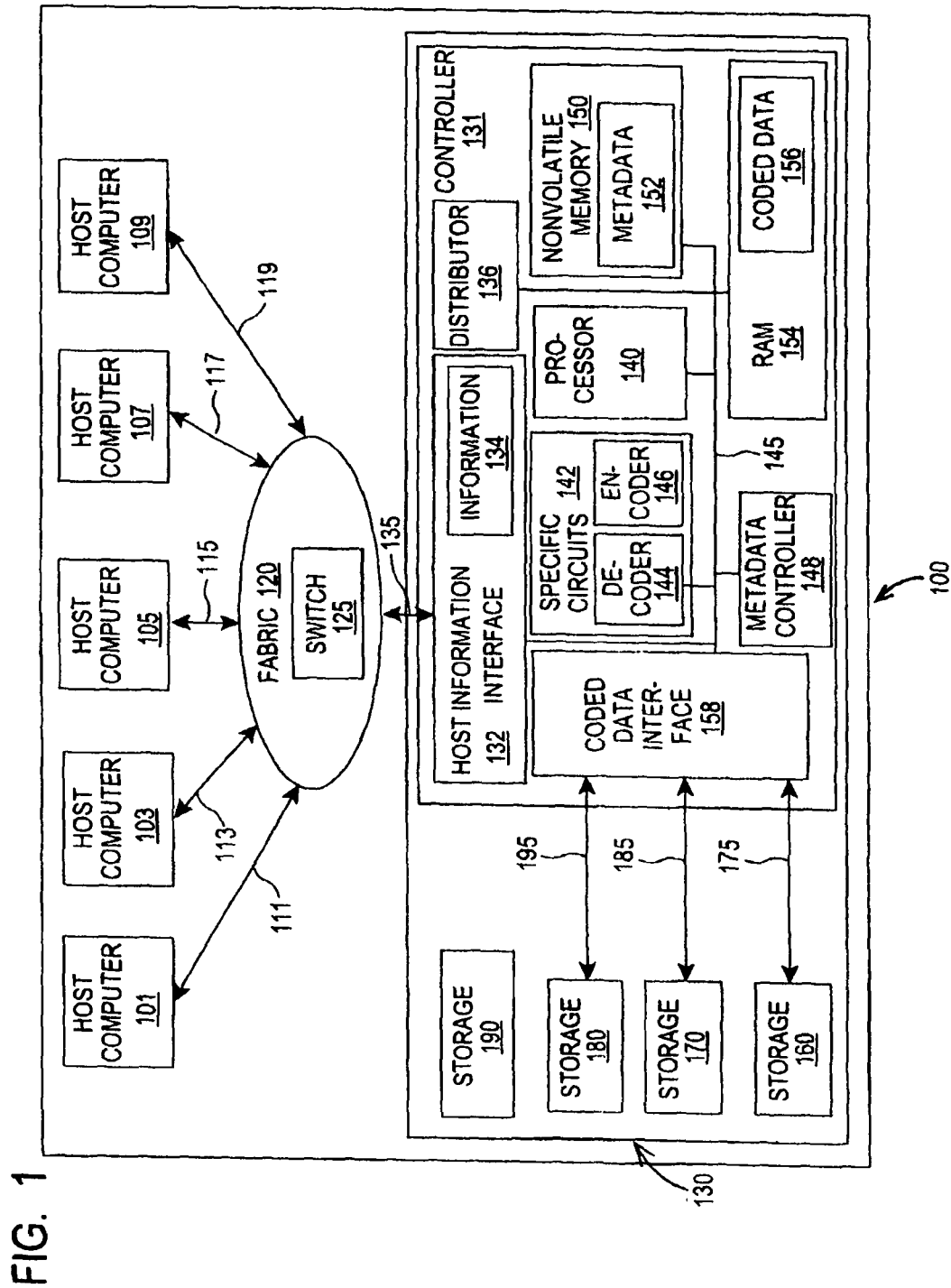
FIG. 1 is a block diagram illustrating one embodiment of Applicant' data storage system.

FIG. 1 illustrates Applicant' data storage system 100. In the illustrated embodiment of FIG. 1, system 100 comprises a switched-access-network, wherein one or more switches 125 are used to create a switching fabric 120. In certain embodiments data storage system 100 is implemented using the Small Computer Systems Interface (SCSI) protocol running over a Fibre Channel ("FC") physical layer. In other embodiments, data storage system 100 may be implemented utilizing other protocols, such as Infiniband, FICON (a specialized form of Fibre Channel CONnectivity), TCP/IP, Ethernet, Gigabit Ethernet, or iSCSI. The switches 125 have the addresses of both the hosts 101, 103, 105, 107, 109 and controller 131 so that any of hosts 101, 103, 105, 107, and/or 109, can be interchangeably connected to any controller 131.

Host computers 101, 103, 105, 107, and 109, each comprise a computing system, such as a mainframe, personal computer, workstation, and combinations thereof, including an operating system such as Windows, AIX, Unix, MVS, LINUX, etc. (Windows is a registered trademark of Microsoft Corporation; AIX is a registered trademark and MVS is a trademark of IBM Corporation; UNIX is a registered trademark in the United States and other countries licensed exclusively through The Open Group; and LINUX is a registered trademark of Linus Torvald). In certain embodiments, host computers 101, 103, 105, 107, and 109 further include a storage management program. The storage management program in the host computers 101, 103, 105, 107, and 109 may include the functionality of storage management type programs known in the art that manage the transfer of data to and from a data storage and retrieval system, such as the IBM DFSMS implemented in the IBM MVS operating system.

Host computers 101, 103, 105, 107, and 109, are coupled to fabric 120 utilizing I/O interfaces 111, 113, 115, 117, and 119, respectively. I/O interfaces 111, 113, 115, 117, and 119, may be any type of I/O interface; for example, a FC arbitrated loop, a point-to-point FC connection to fabric 120 or another form of one or more signal lines used by host computers 101, 103, 105, 107, and 109, to transfer information directly to and from fabric 120. Fabric 120 includes, for example, one or more FC switches 125 used to connect two or more computer networks. In certain embodiments, FC switch 125 is a conventional router switch. In an alternate embodiment, host computers 101, 103, 105, 107, and/or 109, are connected in a point-to-point configuration to storage controller 131 without a switch.

Switch 125 interconnects host computers 101, 103, 105, 107, and 109, to controller 131 across I/O interface 135. I/O interface 135 may be any type of I/O interface, for example, a Fibre Channel, Infiniband, Gigabit Ethernet, Ethernet, TCP/IP, iSCSI, SCSI I/O interface or one or more signal lines used by FC switch 125 to transfer information respectively to and from controller 131 and subsequently to a plurality of data storage media 160, 170, 180, and 190. Alternately, data storage media 160, 170, 180, and 190, could be physically remote from each other as well as controller 131, so that a single disaster could jeopardize only one of data storage media, 160, 170, 180, and 190. By "data storage medium," Applicant' mean a data storage medium in combination with hardware, software, and/or firmware, required to read data from, and write data to, that data storage medium.

In certain embodiments, data storage media 160, 170, 180, and 190, each comprise differing data storage media types. In other embodiments, data storage media 160, 170, 180, and 190, each comprise differing storage locations disposed within one holographic data storage medium.

Storage array 130 comprises controller 131 and storage 160, 170, 180, and 190. Controller 131 and storage 160, 170, 180, and 190 may be co-located in a common frame or box. Alternately, controller 131 and storage 160, 170, 180, and 190 may be spread apart geographically, for disaster recovery reasons, in what is sometimes called a geoplex. Storage 160, 170, 180, and/or 190 may also have separate and distinct controllers working in conjunction to provide access to said storage in the geoplex.

Controller 131 may take many different forms and may include an embedded system, a distributed control system, a personal computer, workstation, etc. In the illustrated embodiment of FIG. 1, storage controller 131 comprises processor 140, metadata controller 148, random access memory (RAM) 154, nonvolatile memory 150, specific circuits 142, coded data interface 158, and host information interface 132. Host information interface 132 holds information 134 which will either be encoded by encoder 146 during a write operation to storage 160, 170, 180, 190; or has been read and decoded by decoder 144 during a read operation from storage 160, 170, 180, 190. In certain embodiments, RAM 154 is used as a data cache. Processor 140, RAM 154, nonvolatile memory 150, specific circuits 142, metadata controller 148, coded data interface 158 and host information interface 132 communicate with each other across bus 145.

Alternatively, RAM 154 and/or nonvolatile memory 150 may reside in processor 140 along with specific circuits 142, coded data interface 158, metadata controller 148, and host information interface 132. Processor 140 may include an off-the-shelf microprocessor, custom processor, FPGA, ASIC, or other form of discrete logic. In certain embodiments, RAM 154 is used as a cache for data written by hosts 101, 103, 105, 107, and/or 109, or read for hosts 101, 103, 105, 107, and/or 109, to hold calculated data, stack data, executable instructions, etc. In certain embodiments, RAM 154 is used for the temporary storage of coded data 156 received from encoder 146 before that data is stored on data storage media, 160, 170, 180, and 190.

Nonvolatile memory 150 may comprise any type of nonvolatile memory such as Electrically Erasable Programmable Read Only Memory (EEPROM), flash Programmable Read Only Memory (PROM), battery backup RAM, hard disk drive, or other similar device. Nonvolatile memory 150 is typically used to hold the executable firmware and any nonvolatile data, such as metadata 152.

In certain embodiments, coded data interface 158 comprises one or more communication interfaces that allow processor 140 to communicate with data storage media 160, 170, 180, and 190. Host information interface 132 allows processor 140 to communicate with fabric 120, switch 125 and hosts 101, 103, 105, 107, and/or 109. Examples of coded data interface 158 and host information interface 132 include serial interfaces such as RS-232, USB (Universal Serial Bus), SCSI (Small Computer Systems Interface), Fibre Channel, Gigabit Ethernet, etc. In addition, coded data interface 158 and/or host information interface 132 may comprise a wireless interface such as radio frequency, such as and without limitation, Bluetooth, or an optical communications device, such as and without limitation a device using Infrared frequencies.

In certain embodiments, metadata controller 148 is implemented in processor 140 by software, firmware, dedicated logic or combinations thereof. In addition, all or part of metadata controller 148 may reside outside controller 131, such as in a software implementation in one of hosts 101, 103, 105, 107, and/or 109. Metadata controller 148, manages metadata associated with information received for storage as coded data on storage devices. In certain embodiments, metadata controller 148 is responsible for generating, changing, maintaining, storing, retrieving and processing metadata (i.e. metadata 152) associated with information received for storage as coded data.

In certain embodiments, distributor 136 is implemented in processor 140 by software, firmware, dedicated logic or combinations thereof. In addition, all or part of distributor 136 may reside outside controller 131, such as in a software implementation in one of hosts 101, 103, 105, 107, and/or 109. Distributor 136 distributes coded data (i.e. coded data 156) to RAM, and/or directly to storage devices in a format (described below) such that the coded data and/or the source information may be decoded and/or reconstructed from non-failing storage devices in the case where one or more storage devices have failed. When distributor 136 distributes the data to the plurality of data storage media, such as media 160, 170, 180, and 190, the distribution is done in accordance with metadata 152, so that the distributed data can be later read from the storage devices.

Figure 4A:
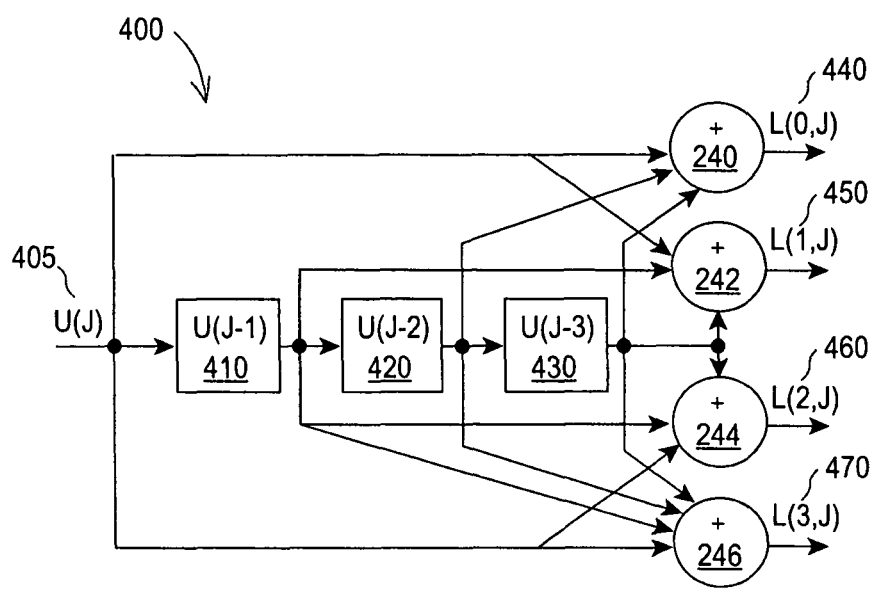
FIG. 4A illustrates an encoding circuit implementing the convolution encoding algorithm of FIGS. 2 and 3.

Specific circuits 142 provide additional hardware to enable controller 131 to perform unique functions, such as fan control for the environmental cooling of data storage media, 160, 170, 180, and 190, controller 131 and encoder 146. Encoder 146 may be implemented as a convolution encoder, such as and without limitation convolution encoder 400 (FIG. 4A). Specific circuits 142 may comprise electronics that provide Pulse Width Modulation (PWM) control, Analog to Digital Conversion (ADC), Digital to Analog Conversion (DAC), exclusive OR (XOR), etc. In addition, all or part of specific circuits 142 may reside outside controller 131, such as in a software implementation in one of hosts 101, 103, 105, 107, and/or 109.

Figure 3:
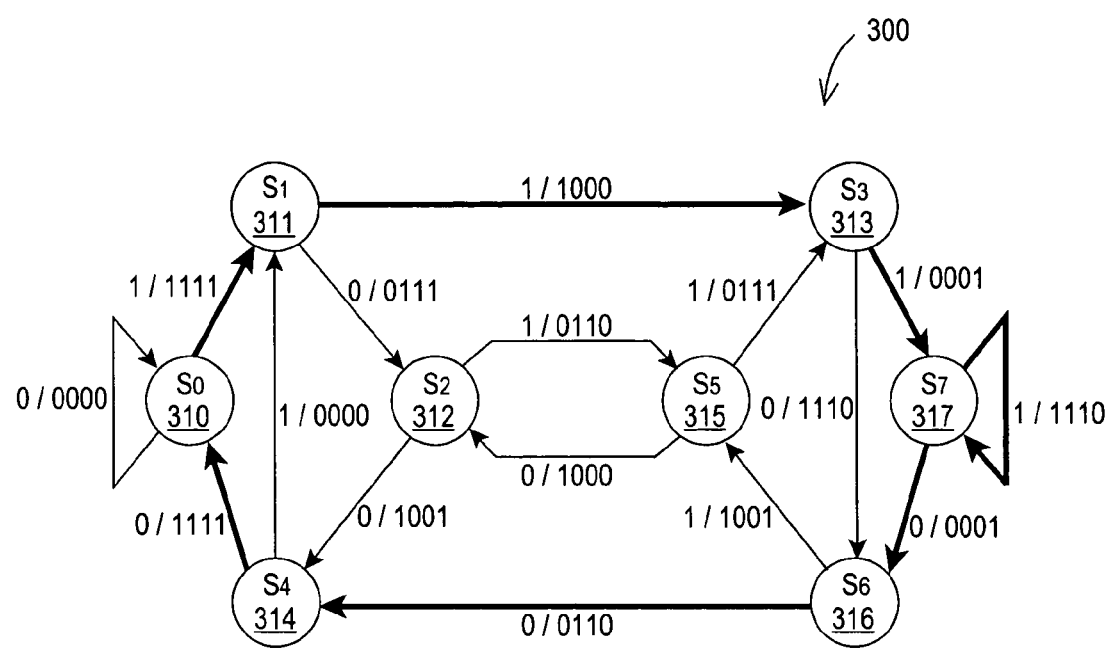
FIG. 3 comprises a state diagram illustrating the 8 states recited in FIG. 2.

In certain embodiments, encoder 146 may be implemented as a convolution encoder. Referring now to FIGS. 2 and 3, table 200 and state diagram 300 illustrate one embodiment of Applicant' apparatus and method which utilize a convolution encoding algorithm. This description of Applicant' apparatus and method should not be taken as limiting Applicant' apparatus and method to use of only the convolution encoding algorithm shown in table 200 and state diagram 300. Rather, in other embodiments Applicant' method utilizes differing convolution encoding algorithms.

The encoding algorithm of FIGS. 2 and 3 comprises eight states: $S_0$ 310, $S_1$ 311, $S_2$ 312, $S_3$ 313, $S_4$ 314, $S_5$ 315, $S_6$ 316 and $S_7$ 317. Discrete transitions between states are limited in number and direction. For example, the encoding process starting at state $S_0$ 310 can only transition back to $S_0$ 310 or forward to $S_1$ 311. Similarly, the process from $S_1$ 311 can only transition to $S_2$ 312 or $S_3$ 313, etc. Each transition between states results in the encoding of one bit of information into four bits of error correction coded data as shown in FIGS. 2 and 3.

Table 200 (FIG. 2) comprises four columns: initial state 201, destination state 202, information 203, and error correction coded data 204. There are a total of sixteen rows in table 200, based on a total of eight states and two possible transitions from one specific state to the next immediately-possible states. Table 200 was generated via state diagram 300 and is used herein to illustrate the encoding of information to produce coded data.

Figure 5:
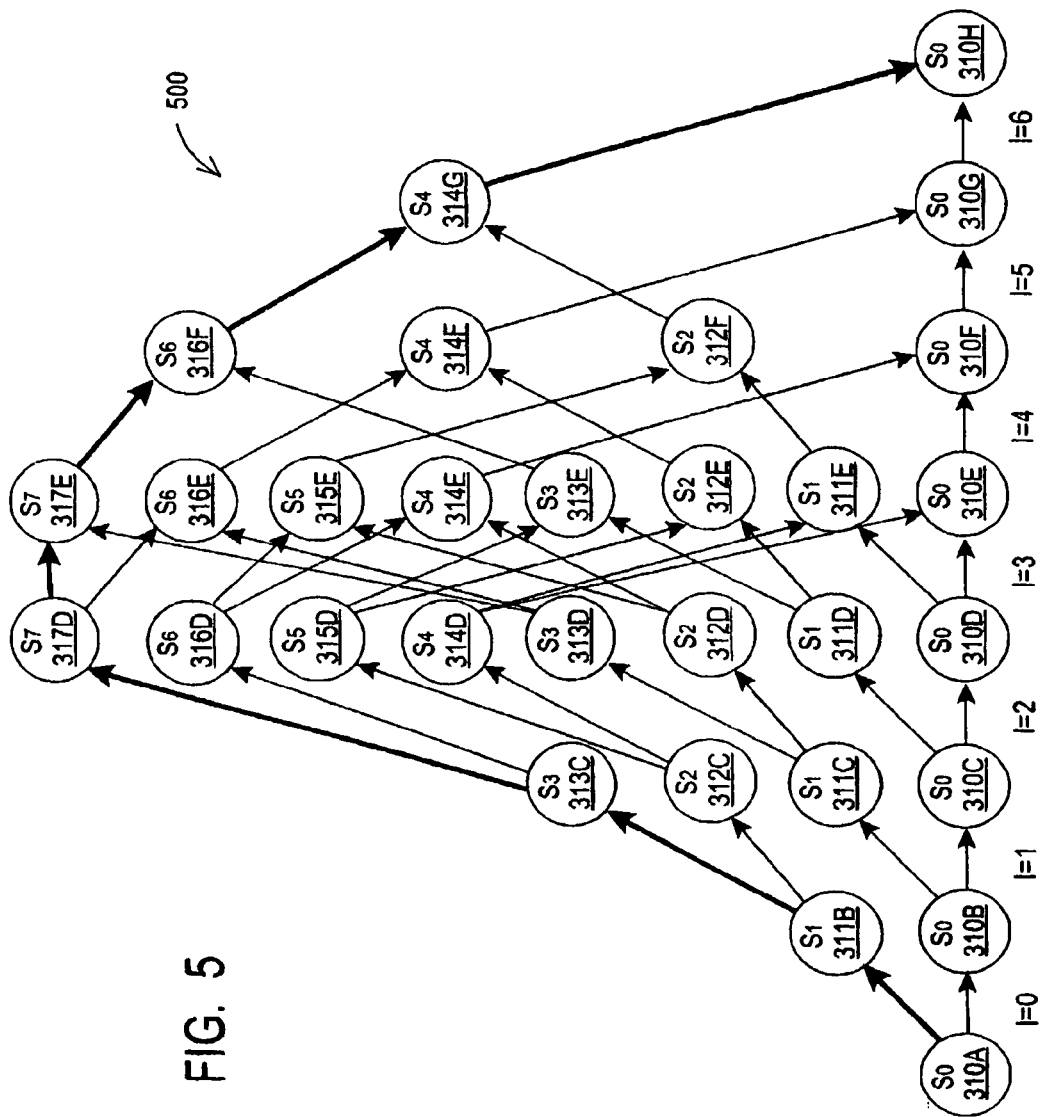
FIG. 5 illustrates a PRML trellis used to decode the error the correction coded data bits generated by the encoder circuit of FIG. 4A and saved in the data storage media of FIG. 4B.

FIGS. 3 and 5 illustrate the encoding of original information comprising bits 1111000. In FIG. 3, the encoding is shown following the highlighted encoding path comprising: $S_0$ 310, $S_1$ 311, $S_3$ 313, $S_7$ 317, $S_7$ 317, $S_6$ 316, $S_4$ 314 and $S_0$ 310. Referring now to FIGS. 2, 3, and 6, $S_0$ 310 to $S_1$ 311 encodes original bit 1 into the four error correction coded bits 1111. $S_1$ 211 to $S_3$ 213 encodes original bit 1 into the four error correction coded bits 1000. $S_3$ 213 to $S_7$ 217 encodes original bit 1 into the four error correction coded bits 0001. $S_7$ 217 to $S_7$ 217 encodes original bit 1 into the four error correction coded bits 1110. $S_7$ 217 to $S_6$ 216 encodes original bit 0 into the four error correction coded bits 0001. $S_6$ 216 to $S_4$ 217 encodes original bit 0 in the four error correction coded bits 0110. Finally, $S_4$ 217 to $S_0$ 210 encodes original bit 0 into the four error correction coded bits 1111.

Using the convolution encoding algorithm described hereinabove, original information 1111000 is encoded into 4 error correction coded data sets for storage in storage media 160, 170, 180, and 190. Using the convolution encoding algorithm illustrated in FIGS. 2, 3, and 6, original information 1111000 is encoded into a first error correction coded data set comprising the bits 1101001, wherein that first set of error correction coded data is stored in first data storage medium 160 (FIG. 1). Using the convolution encoding algorithm illustrated in FIGS. 2, 3, and 6, original information 1111000 is encoded into a second error correction coded data set comprising the bits 1001011, wherein that second set of encoded data is stored in second data storage medium 170 (FIG. 1). Using the convolution encoding algorithm illustrated in FIGS. 2, 3, and 6, original information 1111000 is encoded into a third error correction coded data set comprising the bits 1001011, wherein that third set of encoded data is stored in third data storage medium 160 (FIG. 1). Using the convolution encoding algorithm illustrated in FIGS. 2, 3, and 6, original information 1111000 is encoded into a fourth error correction coded data set comprising the bits 1010101, wherein that fourth set of encoded data is stored in fourth data storage medium 160 (FIG. 1).

Referring now to FIGS. 4A and 4B, encoder circuit 400 is shown for the convolution encoding algorithm shown in table 200 (FIG. 2) and state diagram 300 (FIG. 3). Encoder circuit 400 is one implementation of encoder 146 (FIG. 1) in specific circuits 142 (FIG. 1) of controller 131 (FIG. 1). In other embodiments, encoder circuit 400 is implemented external to controller 131.

Encoder circuit 400 receives input information stream U(J) 405 one bit at a time, for encoding. Encoder circuit 400 comprises an m=3-stage shift register, comprising registers 410, 420, and 430. The initial contents of registers 410, 420, and 430, are preferably zero for the encoding process. The input information stream U(J) 405 and the outputs of registers 410, 420, and 430 are selectively added by n=2 modulo-2 adders (resulting in no carryover for binary addition), comprising adder 240 to produce output L(0,J) 440, adder 242 to produce output L(1,J) 450, adder 244 to product output L(2,J) 460, and adder 246 to produce output L(3,J) 470. The modulo-2 adders may be implemented as XOR (exclusive or) gates in specific circuits 142 or alternatively by use of software, firmware, dedicated logic, etc.

FIG. 4B teaches table 480, showing that data storage medium 160 gets error correction coded data bit L(0,J) 440; data storage medium 170 gets error correction coded data bit L(1,J) 450; data storage medium 180 gets error correction coded data bit L(2,J) 460; and data storage medium 190 gets error correction coded data bit L(3,J) 470.

Because mod-2 addition is a linear operation, the encoder is a linear feed-forward shift register. After buffering, the outputs of encoder circuit 400 are written to the storage media 160, 170, 180, and 190, where storage medium 160 receives error correction coded data bit L(0,J), storage medium 170 receives error correction coded data bit L(1,J), storage medium 180 receives error correction coded data bit L(2,J), and storage medium 190 receives error correction coded data bit L(3,J)).

FIG. 6 recites in tabular form the encoded data shown in the highlighted encoding path in FIG. 3. FIGS. 3 and 6 each illustrate the encoding path $S_0$ 210, $S_1$ 211, $S_3$ 213, $S_7$ 217, $S_7$ 217, $S_6$ 216, $S_4$ 214, and $S_0$ 210 for the error correction encoding of original information 1111000. Referring once again to FIG. 2, Table 200 comprises an ENDEC (encoding-decoding) table, where column 201 illustrates various initial states, column 202 illustrates the possible destination states, column 203 illustrates the possible original data bit, and column 204 illustrates the four error correction coded data bits that are then written to data storage media 160, 170, 180, and 190, respectively.

In certain embodiments, data storage media 160, 170, 180, and 190, comprise differing data storage media types, such as for example and without limitation a magnetic tape, a magnetic disk, an optical disk, an electronic storage device, a holographic data storage medium, and the like. In other embodiments, data storage media 160, 170, 180, and 190, comprise different storage locations disposed within one volume holographic data storage medium.

Decoding the four error correction sets preferably makes use of trellis diagram 500 illustrated in FIG. 5. Such a trellis diagram is often referred to as partial response maximum likelihood ("PRML") decoding. Alternately, a "stack algorithm" could be used for this decoding, and the same result achieved.

States $S_0$-$S_7$ are shown in FIG. 5, wherein the initial contents of registers 410 (FIG. 4), 420 (FIG. 4), and 430 (FIG. 4), are all zero, and wherein trellis diagram 500 begins at state $S_0$ 310A. From $S_0$ 310A, trellis diagram 500 jumps to either $S_0$ 310B or $S_1$ 311B. The increase from suffix A to suffix B in the numbering of the states in trellis diagram 500 is called a branch, and the branch index I is zero when jumping from suffix A to suffix B. From $S_0$ 310B, trellis diagram 500 jumps to either $S_0$ 310C or $S_1$ 311C; and from $S_1$ 311B, jumps to either $S_2$ 312C or $S_3$ 313C, and the branch index I is 1. From $S_0$ 310C, trellis diagram 500 jumps to either $S_0$ 310D or $S_1$ 311D; from $S_1$ 311C jumps to either $S_2$ 312D or $S_3$ 313D; from $S_2$ 312C jumps to either $S_4$ 314D or $S_5$ 315D; or from $S_3$ 313C jumps to either $S_6$ 316D or $S_7$ 317D, and the branch index I is 2.

The next series of jumps in trellis diagram 500 show the full breath of the decoding effort. From $S_0$ 310D, trellis diagram 500 jumps to either $S_0$ 310E or $S_1$ 311E; from $S_1$ 311D jumps to either $S_2$ 312E or $S_3$ 313E; from $S_2$ 312D jumps to either $S_4$ 314E or $S_5$ 315E; or from $S_3$ 313D jumps to either $S_6$ 316E or $S_7$ 317E, and the branch index I is 3. Also, From $S_7$ 317D, trellis diagram 500 jumps to either $S_7$ 317E or $S_6$ 316E; from $S_6$ 316D jumps to either $S_5$ 315E or $S_4$ 314E; from $S_5$ 315D jumps to either $S_3$ 313E or $S_2$ 312E; or from $S_4$ 314D jumps to either $S_1$ 311E or $S_0$ 310E.

Typically, what is shown for branch index I=3 is repeated a plurality of times in a trellis diagram. However, brevity permits only one such iteration in FIG. 5. For the rest of FIG. 5, the trellis diagram is shown to conclude, indicating the ending of the decoding process. From $S_0$ 310E, trellis diagram 300 jumps only to $S_0$ 310F; from $S_1$ 311E jumps only to $S_2$ 312F; from $S_2$ 312E jumps only to $S_4$ 314F; and from $S_3$ 313E jumps only to $S_6$ 316F, and the branch index I is 4. Also, from $S_7$ 317E, trellis diagram 300 jumps only to $S_6$ 316F; from $S_6$ 316E jumps only to $S_4$ 314F; from $S_5$ 315E jumps only to $S_2$ 312F; and from $S_4$ 314E jumps only to $S_0$ 310F. From $S_0$ 310F, trellis diagram 500 jumps only to $S_0$ 310G; and $S_2$ 312F jumps only to $S_4$ 314G; and the branch index I is 5. Also, from $S_6$ 316F, trellis diagram 500 jumps only to $S_4$ 314G; and from $S_4$ 314F jumps only to $S_0$ 310G. Finally, from $S_0$ 310G, trellis diagram 300 jumps only to $S_0$ 310H; and the branch index I is 6. Also, from $S_4$ 314G, trellis diagram 500 jumps only to $S_0$ 310H.

Figure 8:
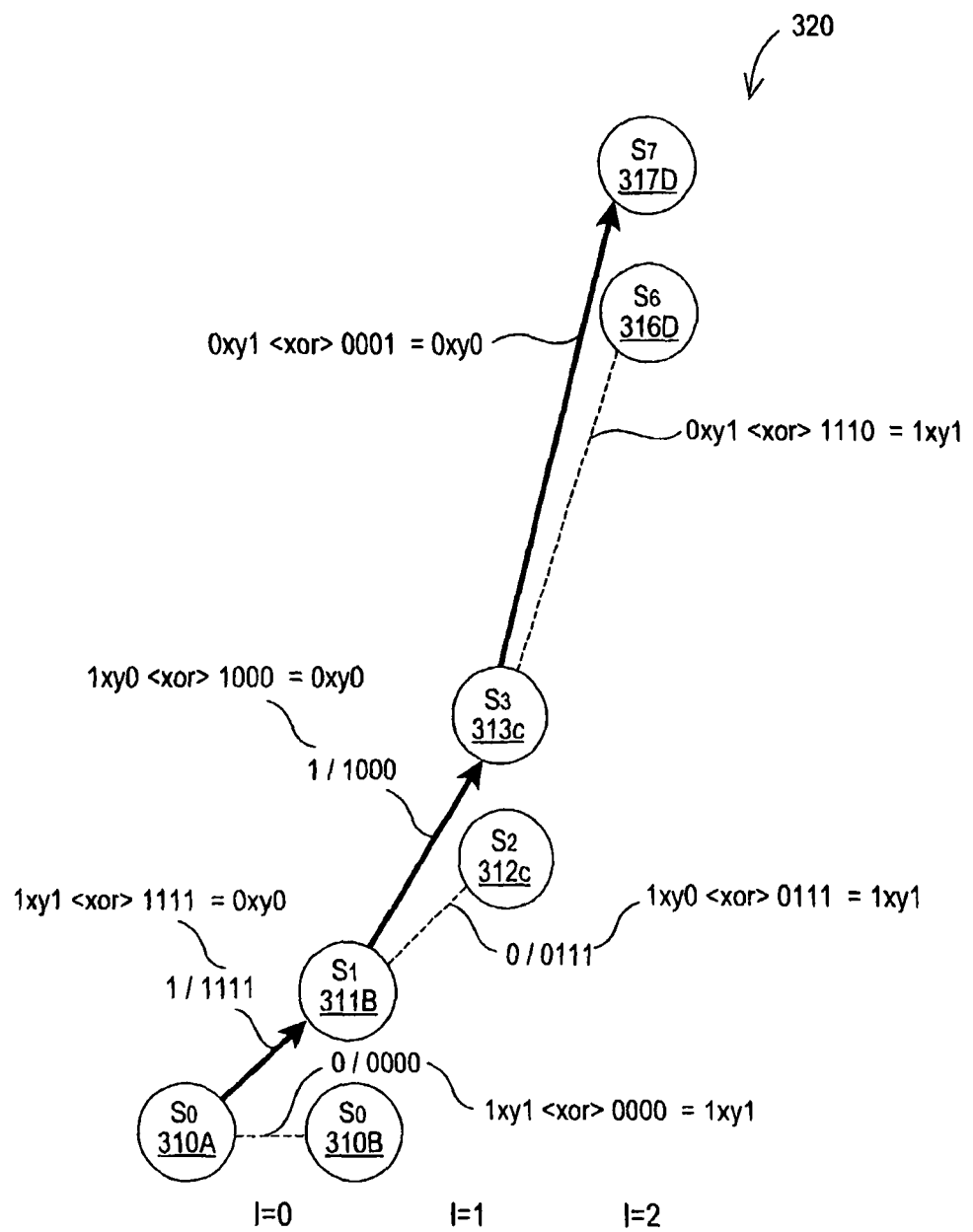
FIG. 8 illustrates a PRML trellis used to implement the method recited in FIG. 7.

FIGS. 7 and 8 illustrate an example of the reconstruction of missing data. In FIGS. 7 and 8, the data is entirely missing for storage media M1 and M2. However, FIG. 8 uses a PRML algorithm, based upon the minimum Hamming distance, to determine the correct path through the trellis decoder diagram 500 (FIG. 5). For the sake of illustration, only 3 branches of the data recovery are discussed.

The first branch (I=0) of data recovery comprises finding the correct data-recovery path for the data 1xy1, wherein x and y represent unknown encoded data because data storage media M1 and M2 are corrupted or unavailable. The Hamming distance from $S_0$ 310A to $S_0$ 310B is 1xy1<xor>0000=1xy1, while the Hamming distance $S_0$ 310A to $S_1$ 311B is 1xy1<xor>1111=0xy0. Because the path from $S_0$ 310A to $S_1$ 310B has the smaller Hamming distance, it is the correct path.

Similarly, the second branch (I=1) of data recovery comprises finding the correct data-recovery path for the data 1xy0. The Hamming distance from $S_1$ 311B to $S_2$ 312C is 1xy0<xor>0111=1xy1, while the Hamming distance $S_1$ 311B to $S_3$ 313C is 1xy0<xor>1000=0xy0. Because the path from $S_1$ 311B to $S_3$ 313C has the smaller Hamming distance, it is the correct path.

Finally, the third branch (I=2) of data recovery comprises finding the correct data-recovery path for the data 0xy1. The Hamming distance from $S_3$ 313C to $S_6$ 316D is 0xy1 <xor>1110=1xy1, while the Hamming distance $S_3$ 313C to $S_7$ 317D to is 0xy1<xor>0001=0xy0. Because the path from $S_3$ 313C to $S_7$ 317D has the smaller Hamming distance, it is the correct path. As those skilled in the art will appreciate, data recovery may involve simultaneous utilization of two branches, but encoded data can nevertheless still be recovered.

Applicant' invention comprises a method to read and write information to (N) data storage media, wherein the method generates (N) sets of error correction coded data from original information. In certain embodiments, a data storage services provider implements Applicant' method to provide data storage services to one or more data storage services customers. In certain embodiments, the data storage services provider owns and/or operates a storage controller, such as storage controller 131 (FIG. 1), and data storage media 160 (FIG. 1), 170 (FIG. 1), 180 (FIG. 1), and 190 (FIG. 1). In certain embodiments, the one or more data storage services customers own and/or operate one or more of host computers 101 (FIG. 1), 103 (FIG. 1), 105 (FIG. 1), 107 (FIG. 1), and/or 109 (FIG. 1).

Figure 9:
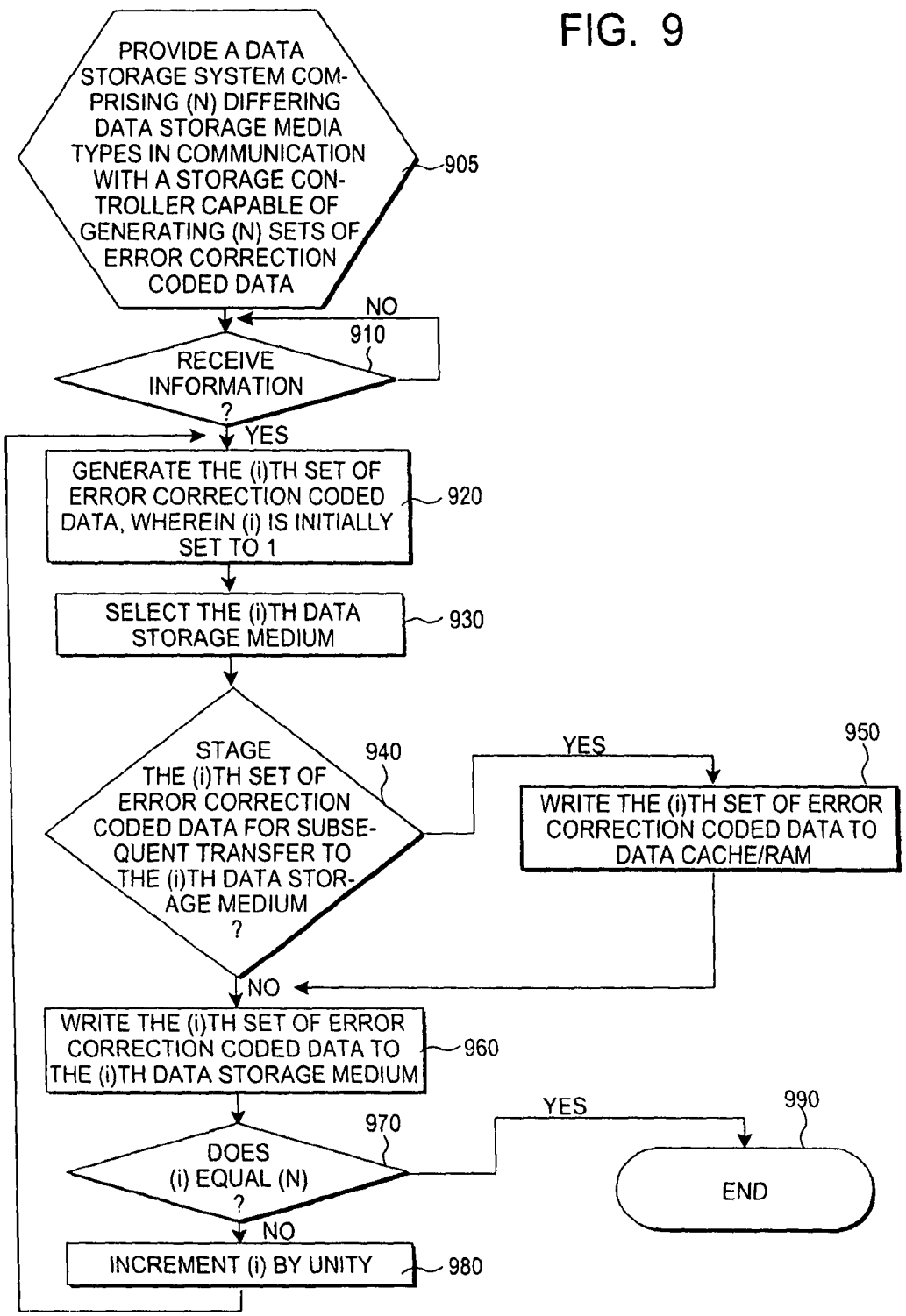
FIG. 9 is a flow chart summarizing the steps of Applicant' method to generate and save a plurality of error correction coded data sets.

FIG. 9 summarizes the steps of Applicant' method to generate and save (N) sets of error correction coded data derived from original information. In certain embodiments, the (N) sets of error correction coded data are written to (N) data storage media, wherein each of those (N) data storage media comprise differing data storage media types, such as and without limitation, a magnetic tape, a magnetic disk, an optical disk, an electronic data storage device, and a holographic data storage medium. In other embodiments, the (N) sets of error correction coded data are written to (N) different storage locations disposed within one volume holographic data storage medium.

Referring now to FIG. 9, in step 905 Applicant' method provides a data storage system, such as data storage system 100 (FIG. 1) wherein that data storage system comprises a storage controller, such as storage controller 131 (FIG. 1), capable of generating (N) sets of error correction coded data from original information. In certain embodiments of Applicant' apparatus and method, Applicant' storage controller is in communication with (N) differing data storage media types. In certain embodiments, (N) is 2. In certain embodiments, (N) is 4. By "(N) sets of error correction coded data," Applicant mean (N) sets of data derived from original information, wherein if at least (N/2) of those (N) sets of error coded data are available, the original information can be recreated.

In step 910, Applicant' method determines if information has been received, such as information 134 in host information interface 132. In certain embodiments, one or more host computers, such as one or more of host computers 101, 103, 105, 107, and/or 109, provide information to Applicant' storage controller, such as storage controller 131 (FIG. 1). In certain embodiments, step 910 is performed by a storage controller, such as storage controller 131 (FIG. 1). In certain embodiments, step 910 is performed by a processor, such as processor 140 (FIG. 1) disposed in the storage controller.

If Applicant' method determines that information has not been received, then the method continues to monitor for the receipt of information. Alternatively, if Applicant' method determines that information has been received, then the method transitions from step 910 to step 920 wherein the method generates the (i)th set of error correction coded data, wherein (i) is initially set to 1, and wherein (i) is greater than or equal to 1 and less than or equal to (N) In certain embodiments, step 910 is performed by a storage controller, such as storage controller 131 (FIG. 1). In certain embodiments, step 910 is performed by a processor, such as processor 140 (FIG. 1) disposed in the storage controller.

In step 930, Applicant' method selects the (i)th data storage medium. In certain embodiments, the (i)th data storage medium comprises a magnetic tape. In certain embodiments, the (i)th data storage medium comprises a magnetic disk. In certain embodiments, the (i)th data storage medium comprises an optical disk, such as phase change optical, magneto-optical, Digital Versatile Disk (DVD), High Definition DVD (HD-DVD), or Blu-Ray. In certain embodiments, the (i)th data storage medium comprises an electronic data storage device.

In certain embodiments, the (i)th data storage medium comprises a holographic data storage medium. In certain embodiments, the (i)th data storage medium comprises a first storage location disposed in a holographic data storage medium.

Figure 11A:
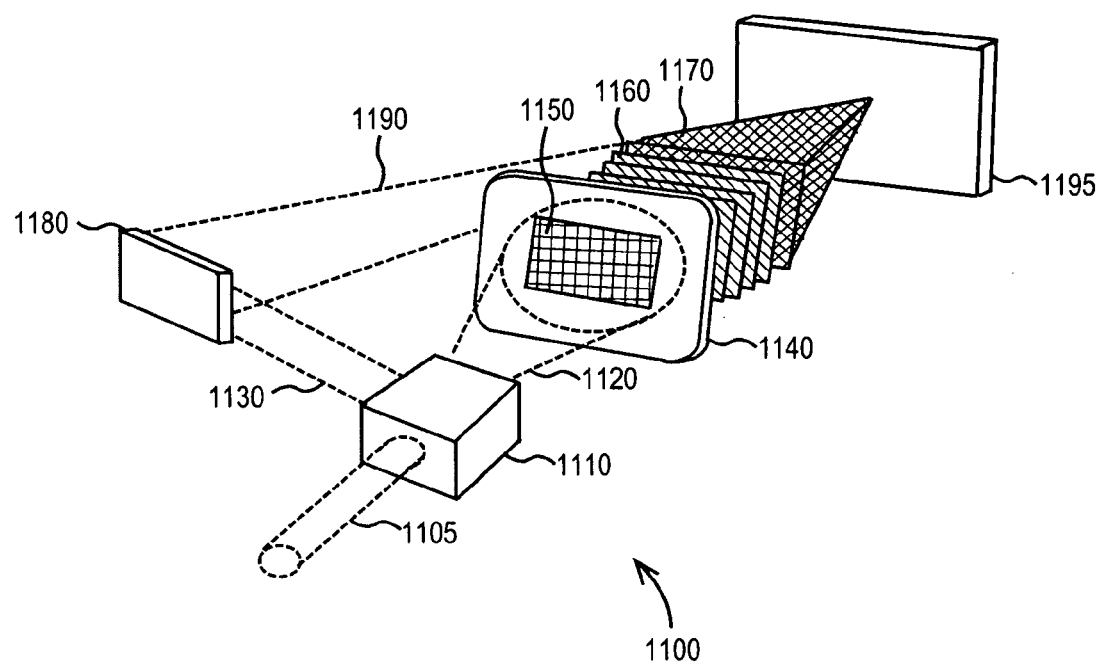
FIG. 11A is a perspective view of a first embodiment of a first apparatus to encode data in a holographic data storage medium.

FIG. 11A illustrates a holographic information recording apparatus 1100. Apparatus 1100 comprises a laser light source 1105, a laser beam splitter 1110, carrier beam 1120, and reference beam 1130. In the illustrated embodiment of FIG. 11A, apparatus 1100 further comprises a Spatial Light Modulator ("SLM") 1140, a data beam 1160, a mirror 1180, and a holographic data storage medium 1195.

Generally, the SLM 1140 is an LCD-type device. Information is represented by either a light or a dark pixel on the SLM 1140 display. The SLM 1140 is typically translucent. Laser light originating from the laser source 1105 is split by the beam splitter 1110 into two beams, a carrier beam 1120 and a reference beam 1130. The carrier beam 1120 picks up the image 1150 displayed by the SLM 1140 as the light passes through the SLM 1140.

Reference beam 1130 is reflected by the mirror 1180 to produce reflected reference beam 1190. Reflected reference beam 1190 interferes with the data beam 1160 to form hologram 1170. The resulting hologram 1170 is stored on a holographic storage medium 1195. Mirror 1180 is typically a first-surface mirror.

Figure 11B:
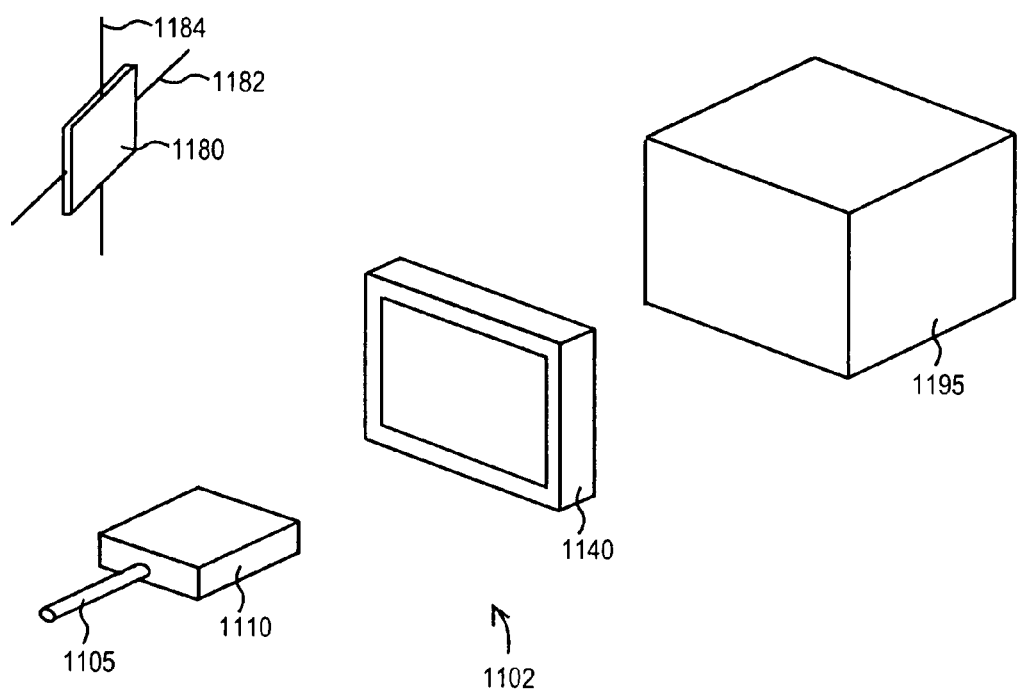
FIG. 11B is a perspective view of a second embodiment of the first apparatus of FIG. 11A.

Referring now to FIG. 11B, in certain embodiments of Applicant' apparatus mirror 1180 can be rotated around axis 1182, and/or axis 1184, such that holograms comprising error correction coded data sets can be encoded throughout volumetric holographic data storage medium 1195. In certain embodiments, Applicant' volumetric holographic data storage medium comprises a square parallelepiped. In certain embodiments, Applicant' volumetric holographic data storage medium comprises a rectangular parallelepiped.

In certain embodiments, (N) is 4 and Applicant' apparatus and method utilize configuration 1102 illustrated in FIG. 11B, wherein the (N) data storage media comprise four different storage locations disposed within one holographic data storage medium. In these embodiments, the (i)th set of error correction coded data is displayed on SLM 1140 with mirror 1180 disposed in a first position, and a first hologram comprising the displayed (i)th set of error correction coded data is encoded at a first location in holographic data storage medium 1195. Subsequently, the (i+1)th set of error correction coded data is displayed on SLM 1140 with mirror 1180 disposed in a second position, and a second hologram comprising the (i+1)th set of error correction coded data is encoded at a second location in holographic data storage medium 1195. Thereafter, the (i+2)th set of error correction coded data is displayed on SLM 1140 with mirror 1180 disposed in a third position, and a third hologram comprising the (i+2)th set of error correction coded data is encoded at a third location in holographic data storage medium 195. Finally, the (i+3)th set of error correction coded data is displayed on SLM 1140 with mirror 1180 disposed in a fourth position, and a fourth hologram comprising the (i+3)th set of error correction coded data is encoded at a fourth location in holographic data storage medium 1195.

Figure 12A:
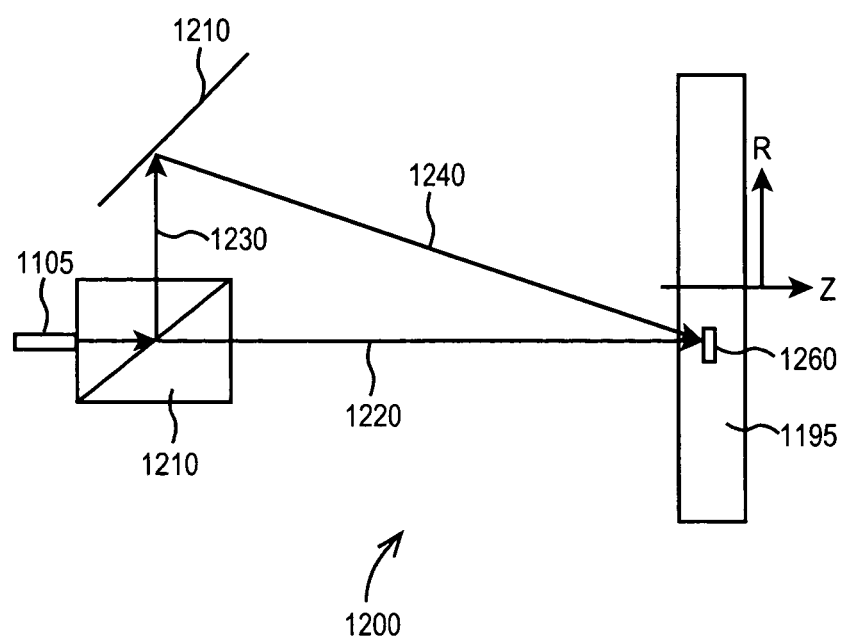
FIG. 12A is a block diagram illustrating a first embodiment of a second apparatus to encode data in a holographic data storage medium.
Figure 12B:
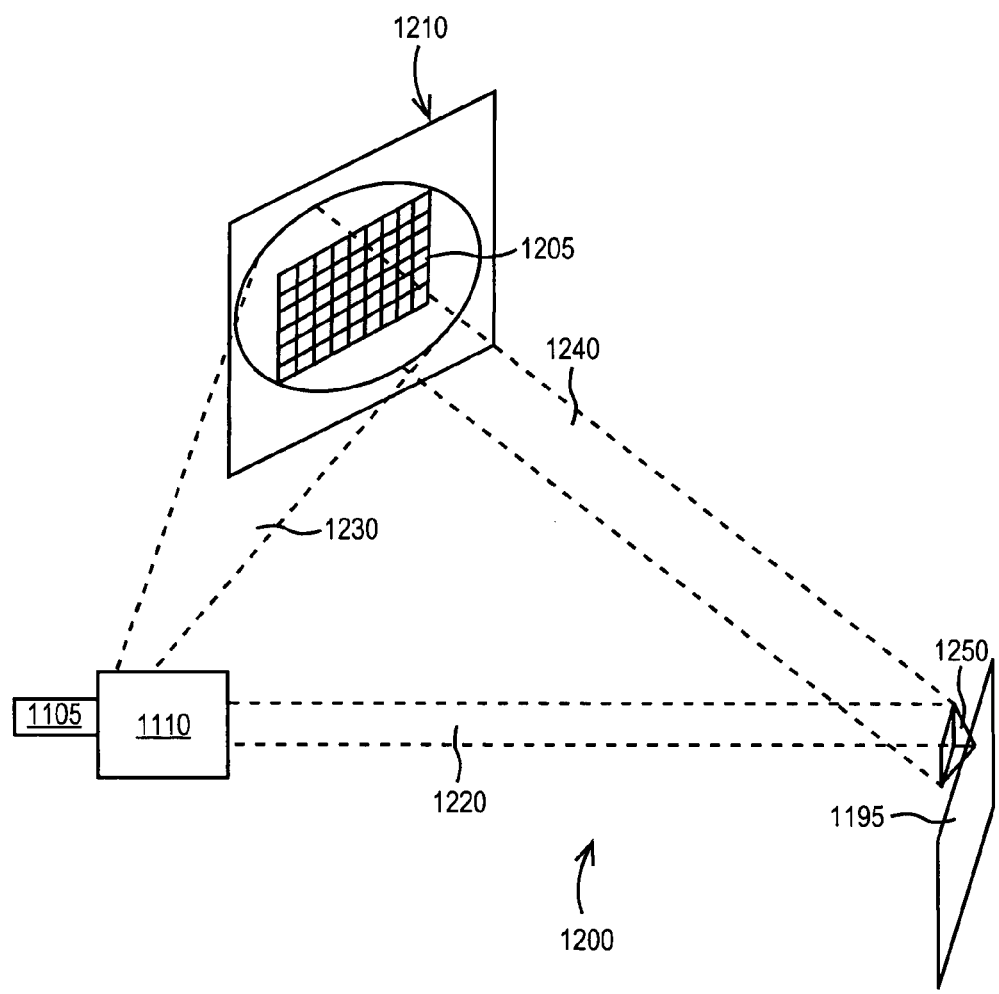
FIG. 12B is a perspective view of the apparatus of FIG. 12A.

Referring now to FIGS. 12A and 12B, holographic information recording apparatus 1200 is described in a pending application having Ser. No. 11/412,658 which is assigned to the common assignee hereof, and which is hereby incorporated by reference herein. Apparatus 1200 comprises laser light source 1105, splitter 1110, reflective spatial light modulator 1210, and holographic storage medium 1195. The light generated by source 1105 is split by splitter 1110 into reference beam 1220, and carrier beam 1230. Using Apparatus 1200, reference beam 1220 is not reflected.

In the illustrated embodiment of FIG. 12B, reflective spatial light modulator ("RSLM") 1210 comprises data image 1205. In certain embodiments, reflective spatial light modulator 1210 comprises an assembly comprising a plurality of micro mirrors. In other embodiments, reflective spatial light modulator 1210 comprises a liquid crystal on silicon ("LCOS") display device. In contrast to nematic twisted liquid crystals used in LCDs, in which the crystals and electrodes are sandwiched between polarized glass plates, LCOS devices have the liquid crystals coated over the surface of a silicon chip. The electronic circuits that drive the formation of the image are etched into the chip, which is coated with a reflective (aluminized) surface. The polarizers are located in the light path both before and after the light bounces off the chip. LCOS devices are easier to manufacture than conventional LCD displays. LCOS devices have higher resolution because several million pixels can be etched onto one chip. LCOS devices can be much smaller than conventional LCD displays.

Carrier beam 1230 picks up image 1205 as the light is reflected off reflective spatial light modulator 1210 to form reflected data beam 1240, comprising image 1205. Unreflected reference beam 1220 interferes with reflected data beam 1240 to form hologram 1250. Hologram 1250 is formed within storage medium 1195 thereby causing the photo-active storage medium to create interference pattern 1260 comprising an encoded hologram 1250. Referring now to FIG. 13, in certain embodiments RSLM 1210 can be rotated around axis 1212, and/or axis 1214, such that holograms comprising data can be encoded throughout the volume of holographic data storage medium 1195.

Referring once again to FIG. 9, in step 940 Applicant' method determines whether to stage in a data cache and/or RAM the (i)th set of error correction coded data of step 920 for later transfer to the (i)th data storage medium selected in step 930. If Applicant' method elects in step to stage the (i)th set of error correction coded data of step 920, then the method transitions from step 940 to step 950 wherein the method writes the (i)th data storage medium selected in step 930 to a data cache or RAM, such as for example RAM 154 (FIG. 1), as coded data 156 (FIG. 1). In certain embodiments, step 950 is performed by a storage controller, such as storage controller 131 (FIG. 1). In certain embodiments, step 950 is performed by a processor, such as processor 140 (FIG. 1) disposed in the storage controller. Applicant' method transitions from step 950 to step 960.

If Applicant' method elects in step not to stage the (i)th set of error correction coded data of step 920, then the method transitions from step 940 to step 960 wherein the method writes the (i)th set of error correction coded data of step 920 to the selected (i)th data storage medium of step 930.

In certain embodiments, the (i)th data storage medium is collocated with the storage controller of step 905. By "collocated," Applicants mean disposed within the same physical enclosure, chassis, frame, and the like. In other embodiments, the (i)th data storage medium is not collocated with the storage controller of step 905.

In certain embodiments, step 960 is performed by a storage controller, such as storage controller 131 (FIG. 1). In certain embodiments, step 960 is performed by a processor, such as processor 140 (FIG. 1) disposed in the storage controller.

Applicant' method transitions from step 960 to step 970 wherein the method determines if all (N) sets of error correction coded data have been generated, i.e. if (i) equals (N). In certain embodiments, step 970 is performed by a storage controller, such as storage controller 131 (FIG. 1). In certain embodiments, step 970 is performed by a processor, such as processor 140 (FIG. 1) disposed in the storage controller. If Applicant' method determines in step 970 that (i) does equal (N), then the method transitions from step 970 to step 990 and ends.

If Applicant' method determines in step 970 that (i) does not equal (N), then the method transitions from step 970 to step 980 wherein the method increments (i) by unity. In certain embodiments, step 980 is performed by a storage controller, such as storage controller 131 (FIG. 1). In certain embodiments, step 980 is performed by a processor, such as processor 140 (FIG. 1) disposed in the storage controller. Applicant' method transitions from step 980 to step 920 and continues as described herein.

FIG. 10 summarizes the steps of Applicant' method to read (N) sets of error correction coded data. In certain embodiments, the (N) sets of error correction coded data are stored on (N) data storage media, wherein each of those (N) data storage media comprise differing data storage media types. In other embodiments, the (N) sets of error correction coded data are stored at (N) different storage locations disposed within one holographic data storage medium.

Referring now to FIG. 10, in step 1005 Applicant' method provides a data storage system, such as data storage system 100 (FIG. 1) wherein that data storage system comprises a storage controller, such as storage controller 131 (FIG. 1), capable of decoding (N) sets of error correction coded data to recreate original information. In certain embodiments, the storage controller of step 1005 is in communication with (N) differing data storage media types. In certain embodiments, (N) is 2. In certain embodiments, (N) is 4. By "(N) sets of error correction coded data," Applicant mean (N) sets of data derived from original information, wherein if at least (N/2) of those (N) sets of error coded data are available, the original information can be recreated.

In step 1010, Applicant' method determines if a read request has been received from a requestor. In certain embodiments, one or more host computers, such as one or more of host computers 101, 103, 105, 107, and/or 109, provide read requests to Applicant' storage controller, such as storage controller 131 (FIG. 1). In certain embodiments, step 1010 is performed by a storage controller, such as storage controller 131 (FIG. 1). In certain embodiments, step 1010 is performed by a processor, such as processor 140 (FIG. 1) disposed in the storage controller.

In certain embodiments, the read request of step 1010 identifies, for each value of (i), the (i)th set of error correction coded data, the (i)th data storage medium, and the (i)th storage address, wherein the (i)th set of error correction coded data is written to the (i)th data storage medium at the (i)th storage address, wherein (i) is greater than or equal to 1 and less than or equal to (N). In certain embodiments, the (i)th storage address comprises one or more track numbers, one or more logical block addresses, one or more file numbers, and the like.

In certain embodiments, the (i)th data storage medium is collocated with the storage controller of step 1005. By "collocated," Applicants mean disposed within the same physical enclosure, chassis, frame, and the like. In other embodiments, the (i)th data storage medium is not collocated with the storage controller of step 1005.

Applicant' method transitions from step 1010 to step 1020 wherein the method determines if the (i)th data storage medium is available, wherein (i) is initially set to 1. In certain embodiments, step 1020 is performed by a data storage device comprising the (i)th data storage medium. In certain embodiments, step 1020 is performed by a storage controller, such as storage controller 131 (FIG. 1). In certain embodiments, step 1020 is performed by a processor, such as processor 140 (FIG. 1) disposed in the storage controller.

If Applicant' method determines in step 1020 that the (i)th data storage medium is not available, then the method transitions from step 1020 to step 1060. Alternatively, if Applicant' method determines in step 1020 that the (i)th data storage medium is available, then the method transitions from step 1020 to step 1030 wherein the method determines if the (i)th set of error correction coded data is readable. In certain embodiments, step 1030 is performed by a data storage device comprising the (i)th data storage medium. In certain embodiments, step 1030 is performed by a storage controller, such as storage controller 131 (FIG. 1). In certain embodiments, step 1030 is performed by a processor, such as processor 140 (FIG. 1) disposed in the storage controller.

If Applicant' method determines in step 1030 that the (i)th set of error correction coded data is not readable, then the method transitions from step 1030 to step 1060. Alternatively, if Applicant' method determines in step 1030 that the (i)th set of error correction coded data is readable, then the method transitions from step 1030 to step 1040 wherein the method reads the (i)th set of error correction coded data from the (i)th data storage medium. In certain embodiments, step 1040 is performed by a data storage device comprising the (i)th data storage medium. In certain embodiments, step 1040 is performed by a storage controller, such as storage controller 131 (FIG. 1). In certain embodiments, step 1040 is performed by a processor, such as processor 140 (FIG. 1) disposed in the storage controller.

Figure 14:
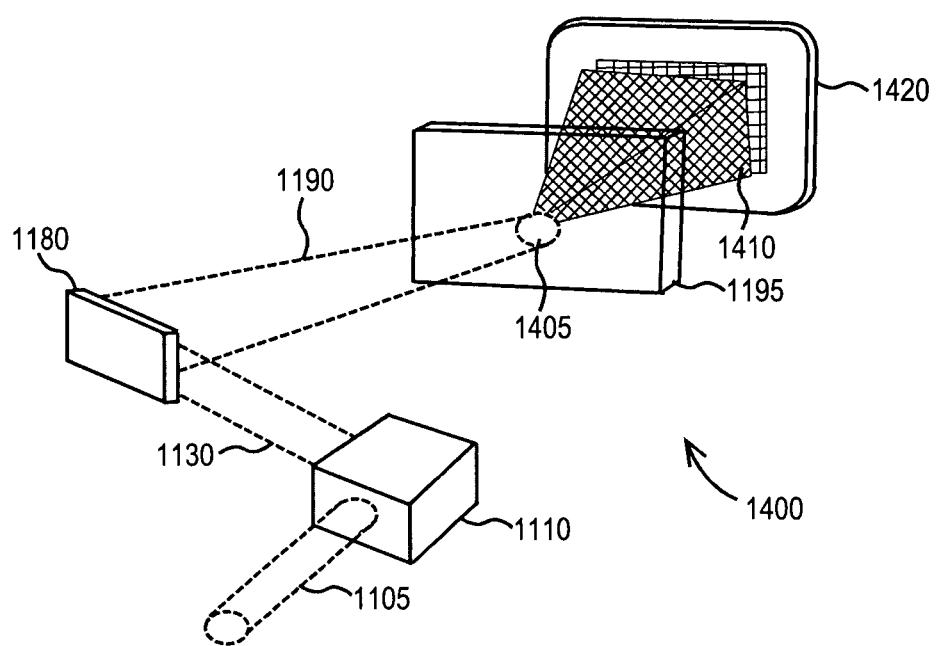
FIG. 14 is a perspective view of a first apparatus to read data from an encoded holographic data storage medium.

In certain embodiments, one of the (N) data storage medium comprises a holographic data storage medium. In other embodiments, each of the (N) data storage media comprise a single holographic data storage medium, wherein each of the individual (N) error correction coded data sets is written to a different storage address disposed in a single holographic data storage medium. FIG. 14 illustrates holographic information reading apparatus 1400. Apparatus 1400 comprises laser light source 1105, beam splitter 1110, holographic storage medium 1195, and optical sensor 1420. Optical sensor 1420 is disposed a distance away from the holographic storage medium 1195 sufficient to accurately capture the image 1410 projected. To read the hologram, reference beam 1130 is reflected off of mirror 1180, to become reflected reference beam 1190, which is then incident on the holographic storage medium 1195. As the reference beam 1190 interferes with the encoded hologram 1405 stored on the storage medium 1195, an image 1410 resembling the original image 1150 (FIG. 11A) displayed by the SLM 1140 (FIG. 11A) is projected against the optical sensor 1420. The optical sensor 1420 then generates the (i)th error correction coded data set comprising image 1410.

Figure 15:
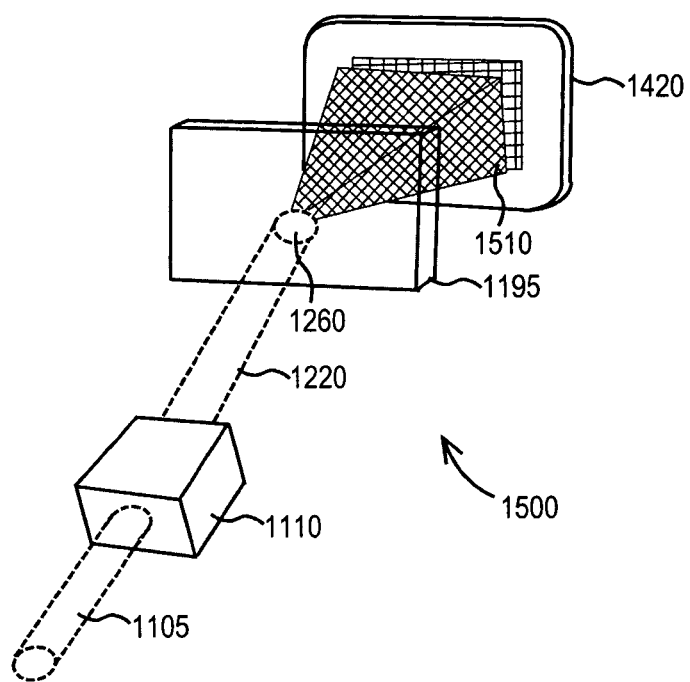
FIG. 15 is a perspective view of a second apparatus to read data from an encoded holographic data storage medium.

FIG. 15 shows holographic information reading apparatus 1500. Apparatus 1500 is described in the above-described pending application having Ser. No. 11/412,658. Apparatus 1500 comprises laser light source 1105, optional beam splitter 1110, and optical sensor 1420. Light source 1105 and splitter 1110 provide reference beam 1220.

The unreflected reference beam 1220 is directed to holographic storage medium 1195 such that reference beam 1220 is diffracted by the interference pattern 1260 (FIG. 12B) to form image 1510 resembling the original image 1205 (FIG. 12B) displayed on Applicant' reflective spatial light modulator 1210. Image 1510 is projected against the optical sensor 1420. The optical sensor 1420 then generates the (i)th error correction coded data set comprising image 1510.

In the illustrated embodiment of FIG. 15, holographic information reading apparatus 1500 comprises beam splitter 1110. In other embodiments, holographic information reading apparatus 1500 does not comprise a beam splitter. In these embodiments, laser light source 1105 provides reference beam 1220, which is directed without reflection to holographic storage medium 1195 such that reference beam 1220 is diffracted by the interference pattern 1260 (FIG. 12A) to form image 1510 resembling the original image 1205 (FIG. 12B) displayed on Applicant' reflective spatial light modulator 210. Image 1510 is projected against the optical sensor 1420. The optical sensor 1420 then generates the (i)th error correction coded data set comprising image 1510.

Referring once again to FIG. 10, Applicant' method transitions from step 1040 to step 1050 wherein the method writes the (i)th set of error correction coded data to a data cache, or to RAM, such as RAM 154 (FIG. 1), as coded data 156 (FIG. 1). In certain embodiments, step 1050 is performed by a storage controller, such as storage controller 131 (FIG. 1). In certain embodiments, step 1050 is performed by a processor, such as processor 140 (FIG. 1) disposed in the storage controller.

Applicant' method transitions from step 1050 to step 1060 wherein the method determines if all (N) sets of error correction coded data have been read or attempted to be read, i.e. if (i) equals (N). In certain embodiments, step 1060 is performed by a storage controller, such as storage controller 131 (FIG. 1). In certain embodiments, step 1060 is performed by a processor, such as processor 140 (FIG. 1) disposed in the storage controller.

If Applicant' method determines in step 1060 that (i) does not equal (N), then the method transitions from step 1060 to step 1070 wherein the method increments (i) by unity. In certain embodiments, step 1070 is performed by a storage controller, such as storage controller 131 (FIG. 1). In certain embodiments, step 1070 is performed by a processor, such as processor 140 (FIG. 1) disposed in the storage controller. Applicant' method transitions from step 1070 to step 1020 and continues as described herein.

If Applicant' method determines in step 1060 that (i) does equal (N), then the method transitions from step 1060 to step 1080 wherein the method reconstructs any unavailable sets of error correction coded data using the available sets of error correction coded data written to a data cache or to RAM 154. In certain embodiments, step 1080 comprises using a partial response maximum likelihood ("PRML") algorithm, based upon the minimum Hamming distance, as described hereinabove and shown in FIGS. 7 and 8. In certain embodiments, step 1080 is performed by a storage controller, such as storage controller 131 (FIG. 1). In certain embodiments, step 1080 is performed by a processor, such as processor 140 (FIG. 1) disposed in the storage controller.

Applicant' method transitions from step 1080 to step 1090 wherein the method generates the information requested in step 1010 using the one or more error correction coded data sets read in step 1040, optionally in combination with the one or more reconstructed error correction coded data sets generated in step 1080. In certain embodiments, step 1090 is performed by a storage controller, such as storage controller 131 (FIG. 1). In certain embodiments, step 1090 is performed by a processor, such as processor 140 (FIG. 1) disposed in the storage controller.

Applicant' method transitions from step 1090 to step 1095 wherein the method returns the information of step 1090 to the requester of step 1010. In certain embodiments, Applicant' method in step 1095 provides the information of step 1090 to one or more host computers, such as one or more of host computers 101, 103, 105, 107, and/or 109 (all of FIG. 1). Applicant's method may additionally include writing any missing sets of error correction coded data to the location from which it was attempted to be read, or it may write the missing sets of error correction coded data to a new location and update the metadata with the new location.

In certain embodiments, individual steps recited in FIG. 9 and/or FIG. 10 may be combined, eliminated, or reordered.

In certain embodiments, Applicant' invention includes instructions residing memory 150 (FIG. 1), where those instructions are executed by a processor, such as processor 140 (FIG. 1), to perform one or more of steps 910, 920, 930, 940, 950, 960, 970, and/or 980, recited in FIG. 9, and/or one or more of steps 1010, 1020, 1030, 1040, 1050, 1060, 1070, 1080, 1090, and/or 1095, recited in FIG. 10.

In other embodiments, Applicant' invention includes instructions residing in any other computer program product, where those instructions are executed by a computer external to, or internal to, system 100, to perform one or more of steps 910, 920, 930, 940, 950, 960, 970, and/or 980, recited in FIG. 9, and/or one or more of steps 1010, 1020, 1030, 1040, 1050, 1060, 1070, 1080, 1090, and/or 1095, recited in FIG. 10. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to generate and store error correction coded data bits, comprising:
    providing an input bit of information;
    using convolution encoding to generate from said input bit of information a first error correction coded data bit, a second error correction coded data bit, a third error correction coded data bit, and a fourth error correction coded data bit;
    writing said first error correction coded data bit to a first data storage medium;
    writing said second error correction coded data bit to a second data storage medium;
    writing said third error correction coded data bit to a third data storage medium;
    writing said fourth error correction coded data bit to a fourth data storage medium.

2. The method of claim 1, wherein
    said generating error correction coded data bits is performed by a convolution encoder using a convolution encoding algorithm.

3. The method of claim 2, further comprising storing said error correction coded data bits in a data cache.

4. The method of claim 1, wherein said first data storage medium and said second data storage medium comprise different data storage locations disposed within a holographic data storage medium.

5. The method of claim 1, further comprising the steps of:
    receiving from a requestor a request to read said input bit of information;
    reading each of said error correction coded data bits;
    generating said input bit of information using said error correction coded data bits; and
    returning said input bit of information to said requestor.

6. The method of claim 5, wherein said reading step further comprises:
    determining if each of said first data storage medium said second data storage medium, said third data storage medium, and said fourth data storage medium are available;
    operative if each of said first data storage medium and said second data storage medium, said third data storage medium, and said fourth data storage medium are available, determining if each of said error correction coded data bits is readable; and
    operative if the each of said error correction coded data bits is readable, reading each of said error correction coded data bits.

7. The method of claim 6, wherein said generating said information step further comprises:
    determining if an error correction coded data bit is unavailable; and
    operative if an error correction coded data bit is unavailable, reconstructing said unavailable error correction coded data bit using a partial response maximum likelihood algorithm.

8. A storage controller comprising a convolution encoder, a convolution encoding algorithm, and a computer readable medium having computer readable program code disposed therein to generate, and store, error correction coded data bits, the computer readable program code comprising a series of computer readable program steps to effect:
    receiving one input bit of information;
    generating from said input bit a first error correction coded data bit, a second error correction coded data bit, a third error correction coded data bit, and a fourth error correction coded data bit using said convolution encoding algorithm;
    writing said first error correction coded data bit to a first data storage medium;
    writing said second error correction coded data bit to a second data storage medium;
    writing said third error correction coded data bit to a third data storage medium;
    writing said fourth error correction coded data bit to a fourth data storage medium.

9. The storage controller of claim 8, wherein said first data storage medium and said second data storage medium comprise different data storage locations disposed within a holographic data storage medium.

10. The storage controller of claim 8, said computer readable program code further comprising a series of computer readable program steps to effect:
    receiving from a requestor a request-to read said input bit of information;
    reading each of said error correction coded data bits;
    generating said input bit of information using said error correction coded data bits; and
    returning said input bit of information to said requestor.

11. The storage controller of claim 10, said computer readable program code to generate said information further comprising a series of computer readable program steps to effect:
    determining each of said error correction coded data bits is available;
    operative if each of said correction coded data bits is available, reading each of said error correction coded data bits; and
    operative if one of said error correction coded data bits is unavailable, reconstructing an unavailable error correction coded data set using a partial response maximum likelihood algorithm.

12. A computer program product encoded in an information storage medium wherein said computer program product is usable with a programmable computer processor to generate-error correction coded data bit, comprising:
    computer readable program code which causes said programmable computer processor to receive an input bit of information;
    computer readable program code which causes said programmable computer processor to generate a first error correction coded data bit, a second error correction coded data bit, a third error correction coded data bit, and a fourth error correction coded data bit from said input bit of information;
    computer readable program code which causes said programmable computer processor to write said first error correction coded data bit to a first data storage medium, write said second error correction coded data bit to a second data storage medium, write said third error correction coded data bit to a third data storage medium, and write said fourth error correction coded data bit to a fourth data storage medium.

13. The computer program product of claim 12, wherein said first data storage medium and said second data storage medium comprise different data storage locations disposed within a holographic data storage medium.

14. The computer program product of claim 12, further comprising:
   computer readable program code which causes said programmable computer processor to receive from a requestor a request to read said input bit of information;
   computer readable program code which causes said programmable computer processor to read each of error correction coded data bits;
   computer readable program code which causes said programmable computer processor to generate said input bit of information using said error correction coded data bits; and
   computer readable program code which causes said programmable computer processor to return said input bit of information to said requestor.

15. The computer program product of claim 14, said computer readable program code to generate said information further comprising:
   computer readable program code which causes said programmable computer processor to determine, if each of said error correction coded data bits is available;
   computer readable program code which, if each of said correction coded data bits is available, causes said programmable computer processor to read each of said error correction coded data bits; and
   computer readable program code which, if each of said error correction coded data bits is not available, causes said programmable computer processor to reconstruct an unavailable error correction coded data bit using a partial response maximum likelihood algorithm.

16. A method to provide data storage services, comprising:
   supplying a storage controller comprising a convolution encoder comprising a convolution encoding algorithm;
   receiving an input bit of information from a data storage services customer;
   generating from said input bit a first error correction coded data bit, a second error correction coded data bit, a third error correction coded data bit, and a fourth error correction coded data bit using said convolution encoding algorithm;
   writing said first error correction coded data bit to a first data storage medium;
   writing said second error correction coded data bit to a second data storage medium;
   writing said third error correction coded data bit to a third data storage medium;
   writing said fourth error correction coded data bit to a fourth data storage medium.

17. The method of claim 16, further comprising the steps of:
   receiving from said data storage services customer a request to read said information;
   reading each of said error correction coded data bits;
   generating said input bit of information using said error correction coded data bits; and
   returning said input bit of information to said data storage services customer.

* * * * *